(12) United States Patent
Shelton et al.

(10) Patent No.: US 7,842,547 B2
(45) Date of Patent: Nov. 30, 2010

(54) LASER LIFT-OFF OF SAPPHIRE FROM A NITRIDE FLIP-CHIP

(75) Inventors: Bryan S. Shelton, Richmond, TX (US); Sebastien Libon, Tervuren (BE); Ivan Eliashevich, Maplewood, NJ (US)

(73) Assignee: Lumination LLC, Cleveland, OH (US)

( * ) Notice: Subject to any disclaimer, the term of this patent is extended or adjusted under 35 U.S.C. 154(b) by 489 days.

(21) Appl. No.: 10/584,434

(22) PCT Filed: Dec. 21, 2004

(86) PCT No.: PCT/US2004/043201
§ 371 (c)(1),
(2), (4) Date: Sep. 7, 2007

(87) PCT Pub. No.: WO2005/062905
PCT Pub. Date: Jul. 14, 2005

(65) Prior Publication Data
US 2008/0113460 A1 May 15, 2008

(51) Int. Cl.
*H01L 21/00* (2006.01)
*H01L 21/44* (2006.01)
(52) U.S. Cl. .......... 438/108; 438/22; 438/113; 257/E21.499; 257/E21.705
(58) Field of Classification Search .......... 438/22, 438/108, 113
See application file for complete search history.

(56) References Cited

U.S. PATENT DOCUMENTS

| | | | |
|---|---|---|---|
| 5,244,818 A | 9/1993 | Jokerst et al. |
| 5,286,335 A | 2/1994 | Drabik et al. |
| 5,376,580 A | 12/1994 | Kish |
| 5,780,321 A | 7/1998 | Shieh et al. |
| 6,071,795 A | 6/2000 | Cheung et al. |
| 6,133,589 A | 10/2000 | Krames et al. |
| 6,248,600 B1 | 6/2001 | Bruce et al. |
| 6,280,523 B1 | 8/2001 | Coman |
| 6,320,206 B1 | 11/2001 | Coman et al. |
| 6,333,522 B1 | 12/2001 | Inoue et al. |
| 6,335,263 B1 | 1/2002 | Cheung et al. |
| 6,420,242 B1 | 7/2002 | Cheung et al. |
| 6,559,075 B1 | 5/2003 | Kelly et al. |
| 6,740,604 B2 | 5/2004 | Kelly et al. |
| 6,746,889 B1 | 6/2004 | Eliashevich et al. |
| 6,831,302 B2 | 12/2004 | Erchak et al. |

(Continued)

FOREIGN PATENT DOCUMENTS

CN 1215503 A 8/1998

(Continued)

*Primary Examiner*—Alexander G Ghyka
(74) *Attorney, Agent, or Firm*—Fay Sharpe LLP

(57) ABSTRACT

In a method for fabricating a flip-chip light emitting diode device, epitaxial layers are deposited on a sapphire growth substrate to produce an epitaxial wafer. A plurality of light emitting diode devices are fabricated on the epitaxial wafer. The epitaxial wafer is diced to generate a device die. The device die is flip chip bonded to a mount. The flip chip bonding includes securing the device die to the mount by bonding at least one electrode of the device die to at least one bonding pad of the mount. Subsequent to the flip chip bonding, the growth substrate of the device die is removed via the application of laser light.

18 Claims, 6 Drawing Sheets

U.S. PATENT DOCUMENTS

| | | |
|---|---|---|
| 6,974,758 B2 | 12/2005 | Kelly et al. |
| 7,125,734 B2 | 10/2006 | Sackrison et al. |
| 2002/0093023 A1 | 7/2002 | Camras et al. |
| 2003/0124769 A1 | 7/2003 | Dotta et al. |
| 2004/0145044 A1 | 7/2004 | Sugaya et al. |
| 2004/0188696 A1 | 9/2004 | Hsing Chen et al. |
| 2004/0209402 A1 | 10/2004 | Chai et al. |
| 2005/0023550 A1 | 2/2005 | Eliashevich et al. |
| 2005/0042845 A1* | 2/2005 | Urbanek .................. 438/483 |
| 2006/0040468 A1 | 2/2006 | Kelly et al. |
| 2006/0240585 A1 | 10/2006 | Epler et al. |
| 2006/0261363 A1 | 11/2006 | Venugopalan |

FOREIGN PATENT DOCUMENTS

| | | |
|---|---|---|
| CN | 1262528 A | 8/2000 |
| DE | 19640594 | 2/1998 |
| EP | 0785580 | 1/1997 |
| JP | 11-263284 | 9/1999 |
| WO | PCT/DE00/04269 | 11/2000 |
| WO | PCT/US00/33366 | 12/2000 |
| WO | PCT/US00/35303 | 12/2000 |
| WO | PCT/EP01/00774 | 1/2001 |
| WO | PCT/US01/02544 | 1/2001 |
| WO | PCT/DE01/00600 | 2/2001 |
| WO | PCT/US01/40358 | 3/2001 |
| WO | PCT/EP01/03846 | 4/2001 |
| WO | PCT/JP01/03947 | 5/2001 |
| WO | WO 01/70005 | 9/2001 |
| WO | WO 2005/062905 | 7/2005 |

* cited by examiner

LASER LIFT-OFF OF SAPPHIRE FROM A NITRIDE FLIP-CHIP

BACKGROUND

The present invention relates to the electronics arts. It is especially relates to group III-nitride flip-chip bonded light emitting diodes for lighting applications, and will be described with particular reference thereto. However, the invention also finds application in conjunction with other types of flip-chip bonded light emitting diodes, and in other flip-chip bonded epitaxial semiconductor devices such as vertical cavity surface emitting laser diodes.

In the flip-chip mounting configuration, a light emitting diode with a light-transmissive substrate and front-side electrodes is bonded "face down" to bonding bumps of a mount, that is, with the epitaxial layers proximate to the mount and the light-transmissive substrate distal from the mount. The flip-chip arrangement has a number of advantages, including improved thermal heat sinking due to the proximity of the front-side active layers to the heat sinking substrate, and reduction of electrode shadowing losses.

In the flip-chip mounting configuration, light is extracted from the substrate side. For epitaxially grown light emitting diodes, the choices for substrate material can be highly restricted since the substrate is selected principally to provide a good base for the epitaxy. Thus, the substrate criteria include a narrow lattice constant range, a substantially atomically flat surface for nucleation of epitaxy, thermal stability at epitaxial growth temperatures, chemical compatibility with the epitaxial process, and so forth.

A problem can arise in the flip-chip configuration when the growth substrate is substantially light-absorbing over some or all of the spectral range of light emission. In this case, light extraction from the substrate is reduced due to light absorption losses in the substrate. Moreover, even if a suitable optically transparent substrate is available, such as is the case for group III-nitride light emitting diodes which can be grown on a transparent sapphire growth substrate, reflection optical losses can occur at the interface between the substrate and the epitaxial layers due to an abrupt discontinuity in refractive index.

A known approach for reducing these substrate-related optical losses is to transfer the epitaxial layers stack from the light-absorbing growth substrate wafer to an optically transparent wafer. Typically, this involves intimately bonding the epitaxial layers stack to the optically transparent wafer, and then removing the growth substrate wafer by etching. After removal of the growth substrate, the epitaxial layers stack remains bonded to the transparent wafer, which is then processed to fabricate devices, and diced to separate individual light emitting diode die. However, achieving intimate bonding between the epitaxial layers stack and the transparent substrate over large areas is difficult. Device yield can be compromised due to the formation of air bubbles or the presence of particles at the interface between the epitaxial layers stack and the transparent substrate during the bonding. Moreover, absent a close refractive index match between the epitaxial layers stack and the transparent substrate, reflections at the interface between the layers stack and the transparent wafer can introduce optical losses.

Another approach is to temporarily secure the epitaxial layers stack to a temporary support wafer using an adhesive layer, followed by thinning of the growth substrate. The epitaxial layers stack, with the remaining thinned growth substrate adhering thereto, is then detached from the temporary support wafer and processed and diced to produce light emitting diode die. The light emitting diode die, which have thinned substrates, are flip chip bonded to a mount. However, the epitaxial layers stack and the remaining thinned growth substrate form a fragile structure after growth substrate thinning. The fragility of this thinned structure complicates the further processing, dicing, and flip chip bonding, resulting in lowered device yield. Moreover, air bubbles, particles, or other imperfections in the adhesion between the temporary support wafer and the epitaxial layers stack can introduce localized damage to the thinned structure, also impacting device yield.

The present invention contemplates an improved apparatus and method that overcomes the above-mentioned limitations and others.

BRIEF SUMMARY

According to one embodiment, a method is provided for fabricating a flip-chip light emitting diode device. Epitaxial layers are deposited on a growth substrate to produce an epitaxial wafer. A plurality of light emitting diode devices are fabricated on the epitaxial wafer. The epitaxial wafer is diced to generate a device die. The device die is flip chip bonded to a mount. The flip chip bonding includes securing the device die to the mount by bonding at least one electrode of the device die to at least one bonding pad of the mount. Subsequent to the flip chip bonding, a thickness of the growth substrate of the device die is reduced.

According to another embodiment, a method is provided for improving light emission of a flip-chip bonded light emitting diode device that is flip chip bonded to a mount. A growth substrate of the light emitting diode device is thinned or removed. The growth substrate of the flip-chip bonded light emitting diode device is arranged distal from the mount. The thinning or removing is performed while epitaxial layers of the light emitting diode device are flip chip bonded to the mount. The flip chip bonding effects a securing of the light emitting diode device to the mount during the thinning or removing.

According to yet another embodiment, a flip-chip light emitting diode device is disclosed. A mount includes bonding bumps. A light emitting diode device die has a device layers stack that is flip chip bonded to the bonding bumps of the mount. An underfill material is arranged between the light emitting diode device die and the mount. The underfill material supports the light emitting diode device die and prevents the light emitting diode device die from fracturing.

Numerous advantages and benefits of the present invention will become apparent to those of ordinary skill in the art upon reading and understanding the present specification.

BRIEF DESCRIPTION OF THE DRAWINGS

The invention may take form in various components and arrangements of components, and in various process operations and arrangements of process operations. The drawings are only for purposes of illustrating preferred embodiments and are not to be construed as limiting the invention. In the cross-sectional views, layer thicknesses are exaggerated for visual clarity, and are therefore not drawn to scale.

DETAILED DESCRIPTION OF THE PREFERRED EMBODIMENTS

Figure 1A:
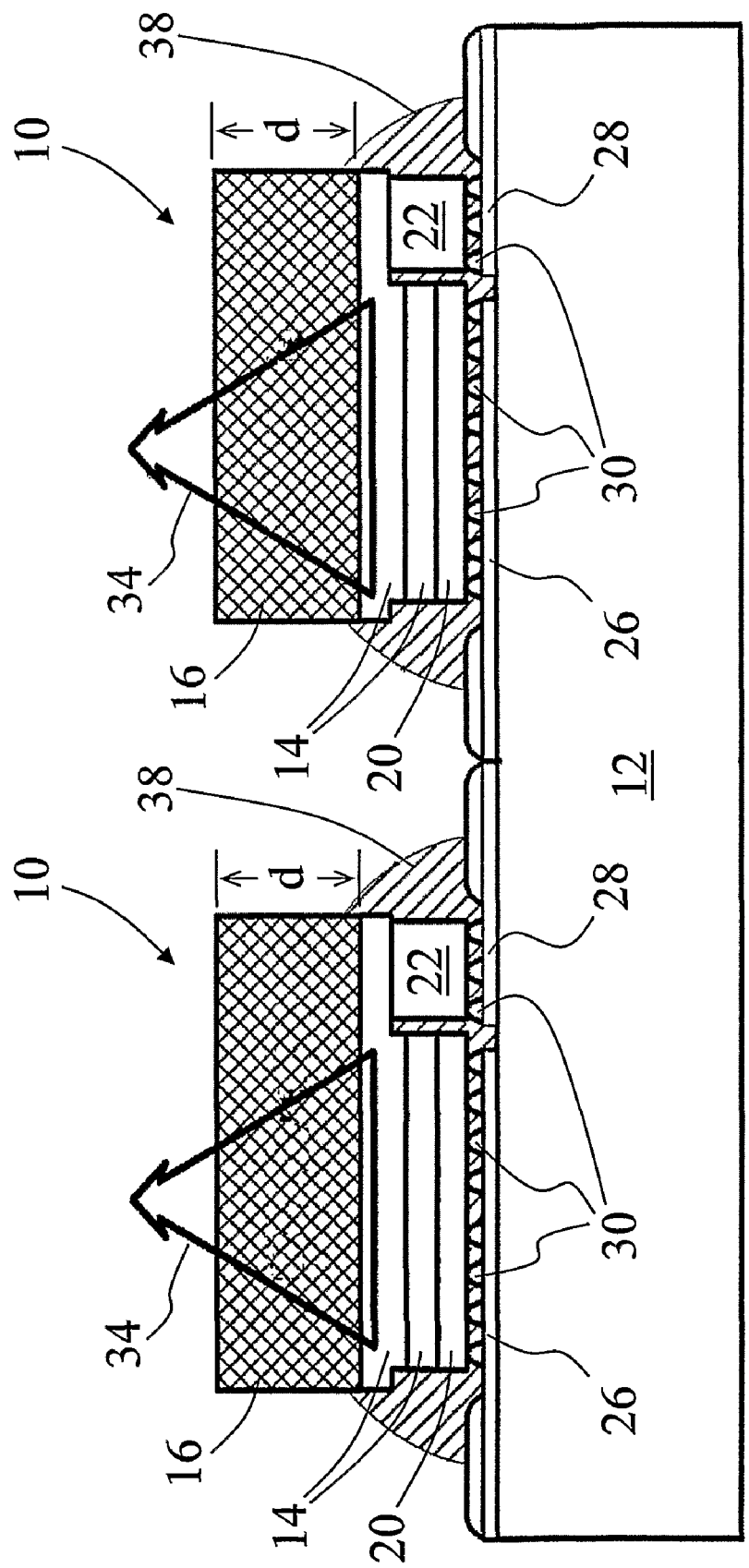
FIG. 1A shows a cross-sectional view of two light emitting diode dice flip chip bonded to a mount.

With reference to FIG. 1A, two exemplary flip chip bonded light emitting diode device die 10 are shown mounted in flip-chip fashion on a mount 12. Each exemplary light emitting diode device die 10 includes a semiconductor device layers stack 14 that is epitaxially deposited on a growth substrate 16. The epitaxial device layers stack 14 defines a light emitting diode device such as a group III nitride ultraviolet or blue light emitting diode, a group III phosphide visible-emission light emitting diode, a group III arsenide vertical cavity surface emitting laser diode, or the like.

In FIG. 1A, the semiconductor layers stack 14 has two exemplary layers corresponding to a simple p/n diode; however, those skilled in the art will appreciate that more complex semiconductor layers stacks can be employed. In a vertical cavity surface emitting laser diode, for example, the layers stack can include dozens of layers that define Bragg reflectors, claddings, and a complex multi-quantum well active region. For a group III nitride ultraviolet or blue light emitting diode with a p-on-n orientation, the layers stack typically includes an epitaxial growth buffer of aluminum nitride or another material, an n-type gallium nitride base layer, an active region of indium gallium nitride, a p-type gallium nitride layer, and optionally a contact layer formed on the p-type gallium nitride layer. Those skilled in the art can readily construct other semiconductor epitaxial layers stacks that are suitable for specific optical applications.

The growth substrate 16 is made of a crystalline material that is suitable for epitaxial growth of the selected semiconductor layers stack 14. For group III nitride epitaxy, the growth substrate is suitably silicon carbide (SiC; for example, conductive SiC, undoped 6H—SiC, or undoped 4H—SiC), gallium nitride, or sapphire. For group III phosphide epitaxy, the growth substrate is suitably gallium arsenide or indium phosphide. For group III arsenide epitaxy, the substrate is suitably gallium arsenide. These examples are not exhaustive; rather, those skilled in the art can readily select a growth substrate having a suitable surface lattice constant, a large-area planar surface, and appropriate thermal and chemical characteristics for promoting high quality, preferably lattice-matched epitaxial growth of the selected semiconductor layers stack 14. Optionally, the growth substrate 16 is off-cut relative to a principle crystal direction. For example, 4H—SiC substrates that are on-axis (that is, no offcut) or offcut at 4° or 8° are available from Cree Materials (Durham, N.C.).

Epitaxial deposition of the semiconductor layers stack 14 on the selected growth substrate 16 is preferably by metal-organic chemical vapor deposition (MOCVD; also known in the art as organometallic vapor phase epitaxy, OMVPE, and similar nomenclatures), molecular beam epitaxy (MBE), liquid phase epitaxy (LPE), or another suitable epitaxial growth technique. As with the growth substrate 16, the choice of epitaxial growth technique is made based on the type of epitaxial layer stack 14 that is to be grown.

The epitaxial deposition is performed over a large-area substrate wafer. For example, silicon carbide wafers for epitaxy are available as generally disk-shaped wafers of diameter about 5 cm to 8 cm in diameter. Gallium arsenide and sapphire are available as larger diameter disk-shaped wafers. The large-area substrate wafer with the epitaxial layers stack 14 deposited thereupon is referred to herein as an epitaxial wafer. The epitaxial wafer is processed using a suitable fabrication process including sub-processes such as wafer cleaning processes, lithography processes, etching processes, dielectric deposition processes, metallization processes, and the like to define a plurality of light emitting diode devices on the wafer. In a typical approach, the fabrication process includes initial wafer cleaning, lithographic definition and etching of device mesas, and lithographic definition and formation of n-type and p-type electrodes.

With continuing reference to FIG. 1A, the light emitting diode device die 10 are lateral current flow geometry devices, and include a p-type electrode 20 disposed on the device mesa and an n-type electrode 22 disposed in a field area off the device mesa. In this embodiment, both electrodes 20, 22 are front-side electrodes. Typically, the electrodes 20, 22 are made of gold or have gold coatings for facilitating low-resistance electrical contact.

The mount 12 includes a first bonding pad 26 arranged to connect with the p-type electrode 20, and a second bonding pad 28 arranged to connect with the n-type electrode 22. A plurality of bonding bumps 30 are arranged on the bonding pads 26, 28. The light emitting diode device die 10 are flip chip bonded to the bonding pads 26, 28 of the mount 12, and more specifically bond to the bonding bumps 30. Flip chip bonding can be achieved by soldering, in which case the bonding bumps 30 are solder bumps. Alternatively, flip chip bonding can be achieved by thermosonic bonding, in which case the bumps are preferably gold-coated copper bumps that are bonded to the gold of the electrodes 20, 22 by a combination of heating and injection of ultrasonic energy. Other bonding methods can also be employed.

With continuing reference to FIG. 1A, the flip chip bonded light emitting diode die 10 have substrates 16 that are relatively thick. The growth substrate wafer, which is typically at least a few centimeters in diameter or other lateral dimension, is diced to generate the individual light emitting diode die 10 that are flip chip bonded to the mount 12. Hence, the substrates 16 of FIG. 1A have a thickness d corresponding to the thickness of the original growth substrate wafer. For example, standard disk-shaped silicon carbide wafers for group III-nitride epitaxy available from Cree Materials (Durham, N.C.) have typical wafer diameters of around 5.0 cm to 7.6 cm, and have wafer thicknesses specified as 254±25.4 microns.

Moreover, silicon carbide is absorbing for the ultraviolet to blue light emission of typical group III-nitride light emitting diode devices. In the flip chip bonding arrangement, light extraction is typically through the substrate side, and is attenuated by substrate absorption. In FIG. 1A, extracted light is indicated schematically by tapered arrows 34. A rapid tapering of the arrow 34 as it passes through the relatively thick light absorbing substrate 16 is indicative of optical losses due to light absorption. Although described with reference to a silicon carbide substrate, it will be appreciated that other substrates that are absorbing for light emitted by the semiconductor layers stack will similarly absorb light and reduce the external light output of the device.

Figure 1B:
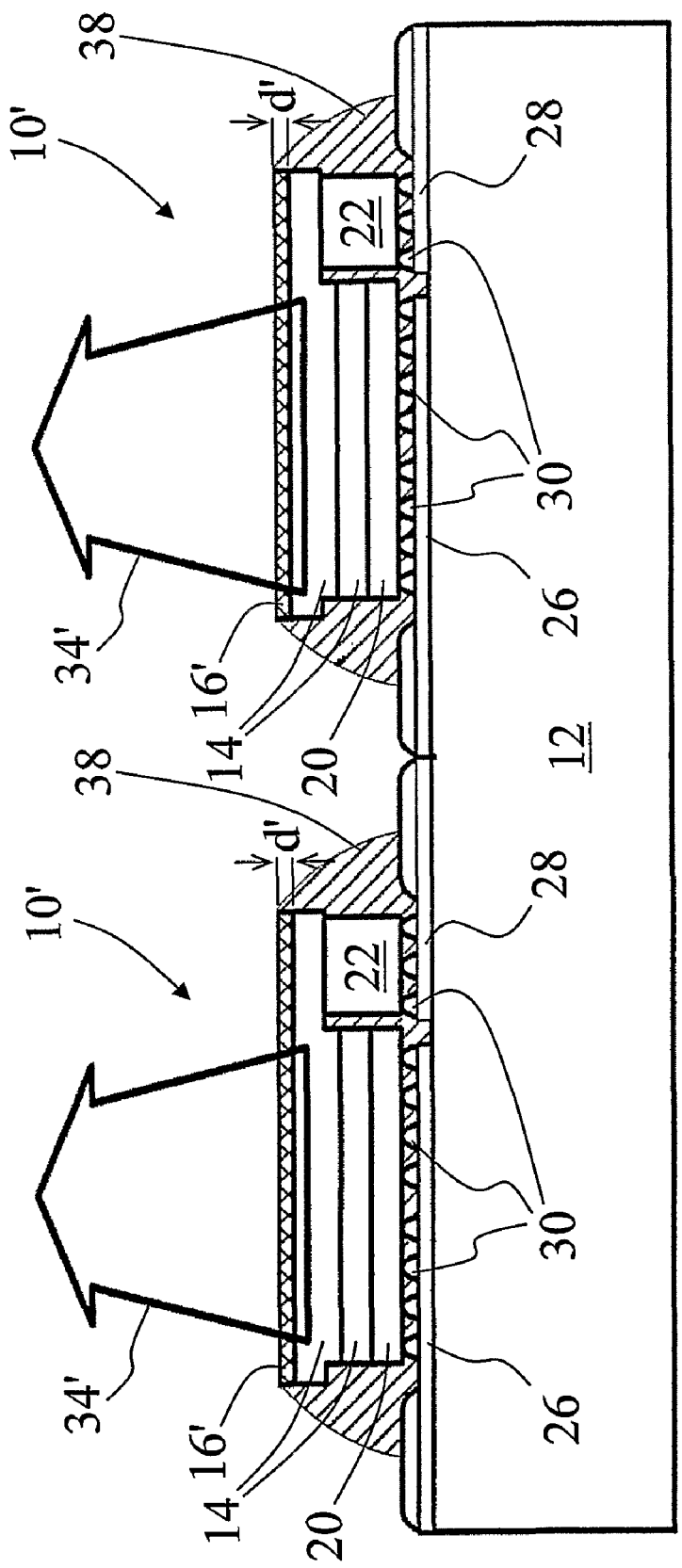
FIG. 1B shows a cross-sectional view of the two light emitting diode dice flip chip bonded to the mount as in FIG. 1A, after thinning of the substrates of the two light emitting diode dice.

With continuing reference to FIG. 1A and with further reference to FIG. 1B, the substrate 16 shown in FIG. 1A is thinned after the flip chip bonding to produce modified light emitting diode die 10' that have thinned substrates 16', as shown in FIG. 1B. The thinned substrate 16' has a thickness d' indicated in FIG. 1B that is substantially less than the thickness d of the unthinned substrate 16. The substrate thinning can be performed by mechanical lapping, mechanical polishing, mechanical grinding, or the like. In another approach, the wafer thinning is performed by wet etching or dry chemical or plasma etching using a suitable etchant. In yet another approach, laser ablation is used to thin the substrate. The reduced thickness d' of the thinned substrate 16' allows more light to exit the light emitting diode die 10', as indicated by less tapered, that is, broader arrows 34' shown in FIG. 1B.

A preferred amount of thinning, that is, a preferred final thickness d', is determined based on several factors. As a light-absorbing substrate is thinned, it generally becomes more light transmissive. Hence, a smaller thickness d' typically promotes light extraction. However, a smaller final thickness d' implies a smaller tolerance in the thinning process. In other words, for a smaller final thickness d', the substrate thinning process should be more precisely controlled to avoid leaving too much substrate material, on the one hand, or removing too much material and possibly damaging the underlying epitaxial layers stack 14, on the other hand.

Figure 2:
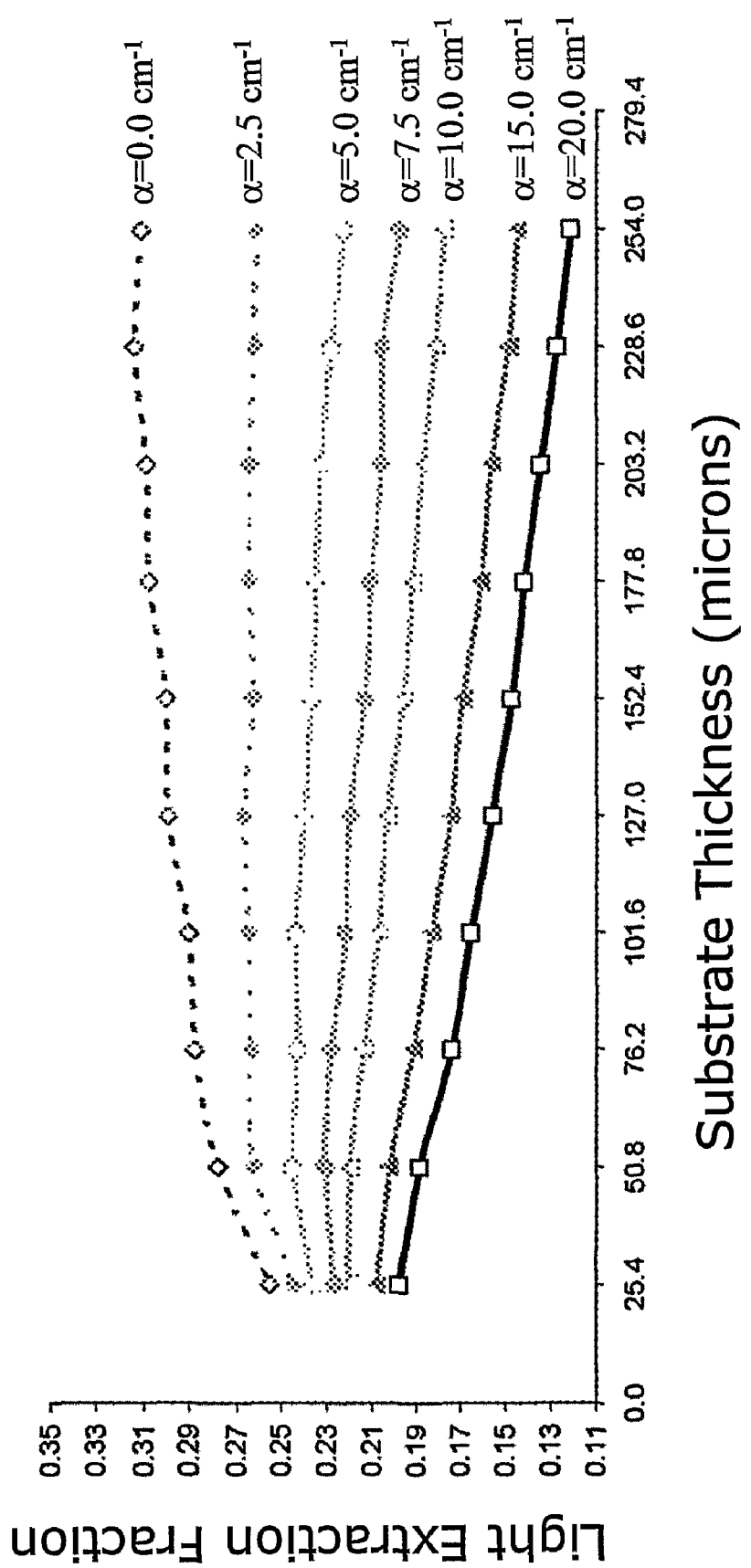
FIG. 2 plots calculated light extraction fraction values of a group III-nitride flip-chip light emitting diode die having a silicon carbide substrate, calculated as a function of substrate absorption coefficient and substrate thickness.

With reference to FIG. 2, calculated light extraction values for a typical group III-nitride device structure on silicon carbide substrates of different thicknesses and absorption characteristics is shown. In the plot of FIG. 2, the abscissa is the substrate thickness in microns, and the ordinate is light extraction fraction. Calculations are shown running from a typical silicon carbide growth wafer thickness of 254 microns down to a highly thinned substrate thickness of about 25.4 microns. Several curves are shown, each corresponding to a different substrate absorption coefficient α, ranging from $\alpha=0.0$ cm$^{-1}$ to $\alpha=20.0$ cm$^{-1}$. Those skilled in the art will appreciate that the absorption coefficient is wavelength dependent, and in the case of silicon carbide also depends upon the polymorph, doping, and other characteristics of the silicon carbide material. The range of absorption coefficients plotted in FIG. 2 is representative of substrate absorption characteristics for typical group III-nitride light emitting diode device emission wavelengths and for typical silicon carbide substrate materials.

With continuing reference to FIG. 2, for $\alpha=5.0$ cm$^{-1}$, thinning from a substrate thickness of 254 microns to a substrate thickness of 50.8 microns provides a relative light extraction improvement of about 10.2% (from a light extraction fraction of 0.2224 to a light extraction of 0.2451). For a higher absorbing substrate the improvement is larger. For example, in the case of $\alpha=20.0$ cm$^{-1}$, the light extraction fraction is 0.1212 for a 254 micron substrate, and increases to 0.1918 for a 25.4 micron substrate. Thus, in the case of $\alpha=20.0$ cm$^{-1}$, thinning from 254 microns to 25.4 microns provides a relative light extraction improvement of about 58.3%.

With reference returning to FIGS. 1A and 1B, thinning the substrate 16 after flip chip bonding, rather than before dicing as has been typically done in the past, can introduce mechanical stability difficulties, especially for thinned substrates 16' having thicknesses d' of about 50 microns or less. Stresses introduced by the bonding or by the substrate thinning process can result in some, most, or all of the light emitting diode devices 10' being operatively degraded or non-functional. For example, some, most, or all of the light emitting diode devices 10' can break during the thinning process due to stresses introduced at the discrete bonding areas corresponding to the bonding bumps 30. Such stresses may be supportable by the light emitting diode die 10 due to its thick substrate 16 and corresponding mechanical robustness, but may be unsupportable by the light emitting diode die 10' because of the fragility of its thinned substrate 16'.

To mechanically support and stabilize the light emitting diode devices during and after thinning, an underfill material 38 is preferably disposed between the light emitting diode device 10 and the mount 12 prior to substrate thinning. The underfill material 38 provides adhesive bonding between the light emitting diode device 10, 10' and the mount 12 that helps secure the devices 10, 10'. The underfill material 38 also provides mechanical support for the thinned light emitting diode device 10' to reduce a likelihood of cracking or other stress-related damage. The support provided by the underfill material 38 is distributed across the area of the light emitting diode device 10, 10' to provide support at or proximate to localized stress regions such as at or around the bonding bumps 30.

The underfill material 38 preferably provides other benefits, such as protection and encapsulation of the semiconductor layers stack 14 and electrodes 20, 22. If the underfill material 38 is thermally conductive, it advantageously provides an additional heat sinking path.

To provide for the thinning of the substrate, the underfill material 38 preferably substantially does not cover the substrate 16, although the underfill material 38 optionally can come part-way up sides of the substrate 16. In some contemplated embodiments, the underfill material does cover the substrate 16, and the excess material covering the substrate 16 is removed during the substrate thinning process. The underfill material 38 is suitably applied as a fluid and then cured or dried before or after bonding. The underfill material 38 is suitably an epoxy, silicone, photoresist, or other material that can be applied in a liquid or flowable form and then cured or dried. Although inclusion of the underfill material 38 is preferred, the underfill material 38 is optionally omitted if the thickness d' of the thinned substrate is above about 50 microns, or if the epitaxial layers stack 14 is sufficiently mechanically strong to be resistant to stress-related damage.

In the case of group III-nitride light emitting diode devices that emit blue or ultraviolet light, a wavelength converting phosphor can be incorporated into the underfill material 38 to convert the blue or ultraviolet light into white light or light having other selected spectral characteristics. Such phosphor incorporation is most beneficial in devices that employ a lateral current flow geometry, such as the light emitting diode device die 10, 10', since in this geometry a substantial amount of light leaks toward the mount 12 through sidewalls of the etched mesa.

Figure 3:
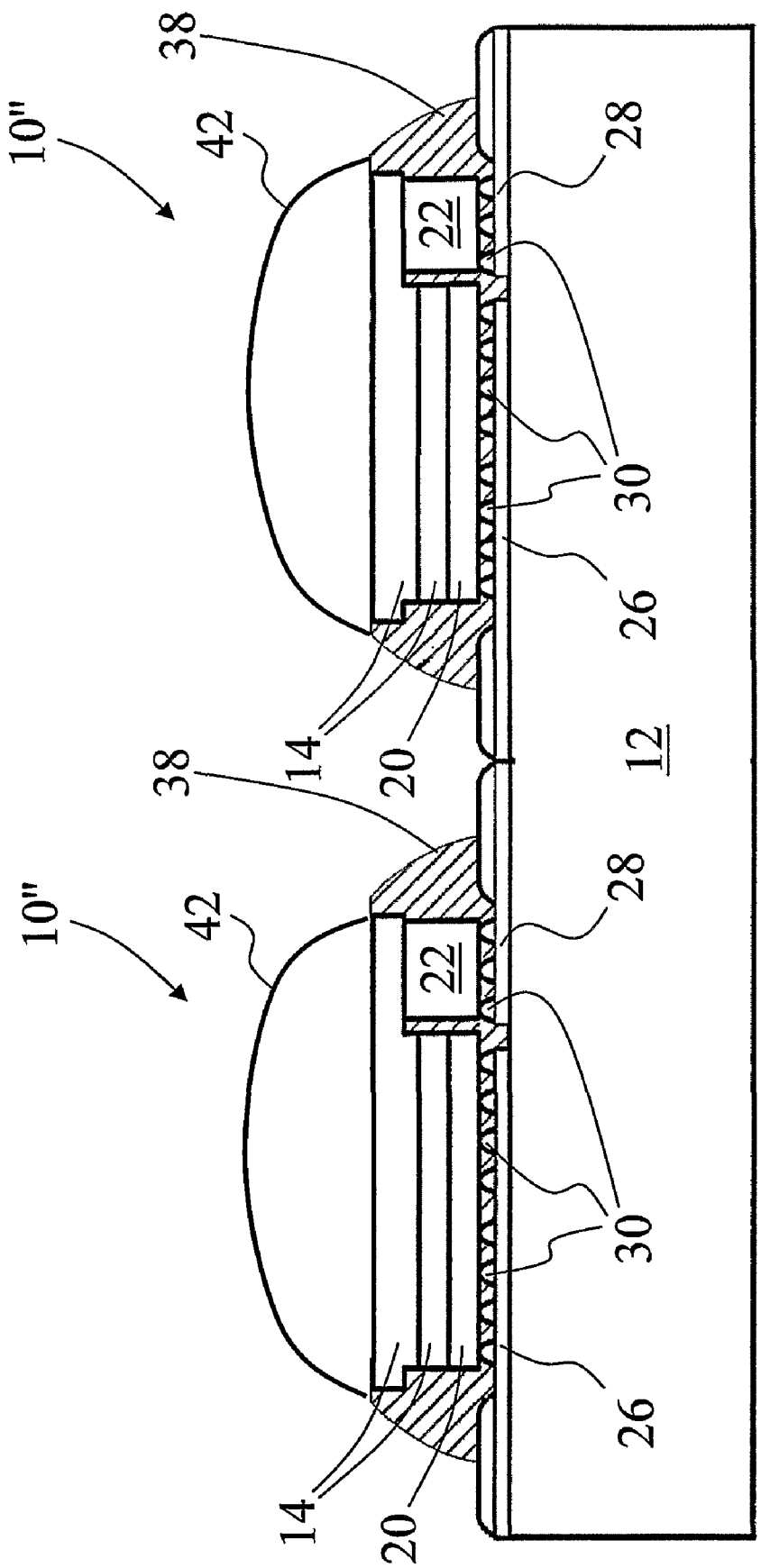
FIG. 3 shows a cross-sectional view of the two light emitting diode dice flip chip bonded to the mount as in FIG. 1A, after removal of the substrates of the two light emitting diode dice.

With reference to FIG. 3, rather than thinning the substrate 16 of FIG. 1A, the substrate 16 can be completely removed, as shown in FIG. 3, to produce the modified flip chip light emitting diode die 10". In the case of a transparent substrate such as a sapphire substrate used in group III-nitride epitaxy, optical losses attributable to the substrate are due to reflection losses rather than absorption losses. Hence, the sapphire should be entirely removed to obviate the reflection optical losses. In one suitable embodiment, a chemical etching is used that removes the substrate material selectively over the material of the adjacent epitaxial layer. In this case, the epitaxial layer of the epitaxial layers stack 14 that is adjacent to the substrate 16 serves as an etch stop, and the chemical etching advantageously terminates or greatly slows when it reaches the etch stop layer.

In another embodiment, an excimer laser is used to remove a sapphire substrate 16 from a flip-chip mounted LED die. One advantage of laser lift-off of the sapphire substrate is that better light extraction can be achieved. Additionally the resulting lower profile provides more options for further packaging. The process of flip-chip mounting can involve relatively large amounts of force that may tend to damage the die. Accordingly, removing the substrate after the chip has been flip-chip mounted (as opposed to before mounting) helps prevent damage to the die during the mounting process insomuch as the then intact substrate provides additional structural support and/or integrity. In addition, there is a built up stress in the device layer because of the lattice mismatch between the sapphire substrate and the device layer which could cause the chip to "curl" upon removal of the substrate. Depending on the size of the chip and the degree of curl, a stress relief agent such as the underfill 38 is applied to the die before removal of the sapphire substrate. If there is relatively little curl in the device layer after the substrate has been removed, the use of another agent to prevent external damage is optionally implemented.

Removing the sapphire substrate from the active region or epitaxial layers 14 of the device has certain challenges. Once the sapphire is removed, the integrity and robustness of the chip is can be comparatively low because the remaining device is only on the order of 10 μm thick as opposed to 100-600 μm with the substrate. The removal of the substrate from a singlated device proves to be a more advantageous process as compared to removing the entire substrate at the larger wafer level because of the nature of the laser lift-off process. Suitably, ultraviolet laser light is illuminated on the back surface or substrate side surface of the epitaxial layers 14 through the transparent sapphire substrate. The laser light degrades the interface between the sapphire and a low-quality AlGaN or GaN nitride nucleation layer that has been formed to ease the lattice mismatch between the materials. During this degradation, gallium metal and nitrogen are released. Then, at slightly elevated temperature, the gallium melts and allows the sapphire to be removed. The surface is then cleaned of any remaining gallium.

As already mention, before the laser lift-off process, the die can be secured to a submount or underlying support structure with either an underfill of epoxy or other material, e.g., that is not electrically active but can provide support to the chip after the substrate is removed. If the distance between the die and underlying support structure is small, a coating material that could be removed later is optionally used to provide temporary support. This could also be an epoxy, but it would not have to flow underneath the chip, just around the edges. Of course, after lift-off, more options exist to treat the flip-chip mounted die to both provide additional strength and also enhance the performance of the device, e.g., an anti-reflection coating may be used to enhance light output from the device; depositing an index-graded film on the chip that would change the total internal reflection and allow for more light output as well, notably, GaN has an index of refraction around 2.3 and epoxy has an index of refraction around 1.5, accordingly materials having indices or refraction between these two are suitably used; a micro-lenses is optionally deposited on the backside of the die; roughening or etching the backside of the die into lenses or other structures is optionally performed; an injection transfer molding process may be carried out to form a large lens over the chip (e.g., the lens is optionally initially a liquid that is harden or alternately the lens may be solid initially); etc.

Typically, complete removal of the substrate 16 provides improved light extraction efficiency compared with retaining the thinned substrate 16'. However, if the substrate 16' provides good refractive index matching to the outside ambient, the thinned substrate 16' can provide better overall light extraction efficiency than is obtained with complete substrate removal. Moreover, complete substrate removal leaves a layer of the epitaxial layers stack 14 exposed to the ambient. In certain cases, this may be undesirable. For example, in a group III-arsenide device grown on a gallium arsenide substrate, if the exposed epitaxial layer has a high aluminum content, it is prone to oxidation. Thus, in such a case it may be preferable to keep a thin portion of the gallium arsenide substrate to cap the high aluminum-content epitaxial layer. Still further, absent an etch stop layer or a thick non-critical base epitaxial layer, complete removal of the substrate 16 involves very precise control of the etch process to avoid etching into and damaging the thin epitaxial layers stack 14.

In the case of removal or substantial thinning of the substrate 16, the resultant light emitting diode device 10', 10" may be so fragile as to be incapable of being a free-standing component. That is, in the case of extreme thinning or removal of the substrate 16, the underfill material 38 advantageously prevents fracture of the light emitting diode device 10', 10". Whether or not the modified light emitting diode device 10', 10" is so fragile that the underfill material 38 prevents its fracture, rather than merely providing additional mechanical support, depends upon the thickness of the epitaxial layers stack 14, the thickness d' of the thinned substrate 16' in the case of incomplete substrate removal, and the mechanical properties of the materials that make up the light emitting diode device 10', 10".

With continuing reference to FIG. 3, an index-matching material, an epoxy lens, discrete microlens, or other optical element 42 can be applied to the epitaxial layer stacks 14 after removal of the substrates 16. In the case of an epoxy lens 42, the epoxy is typically applied in liquid or flowable form and then dried or cured. Although not shown, it will be appreciated that such optical elements can also be disposed on the thinned substrates 16' of FIG. 1B.

Figure 4A:
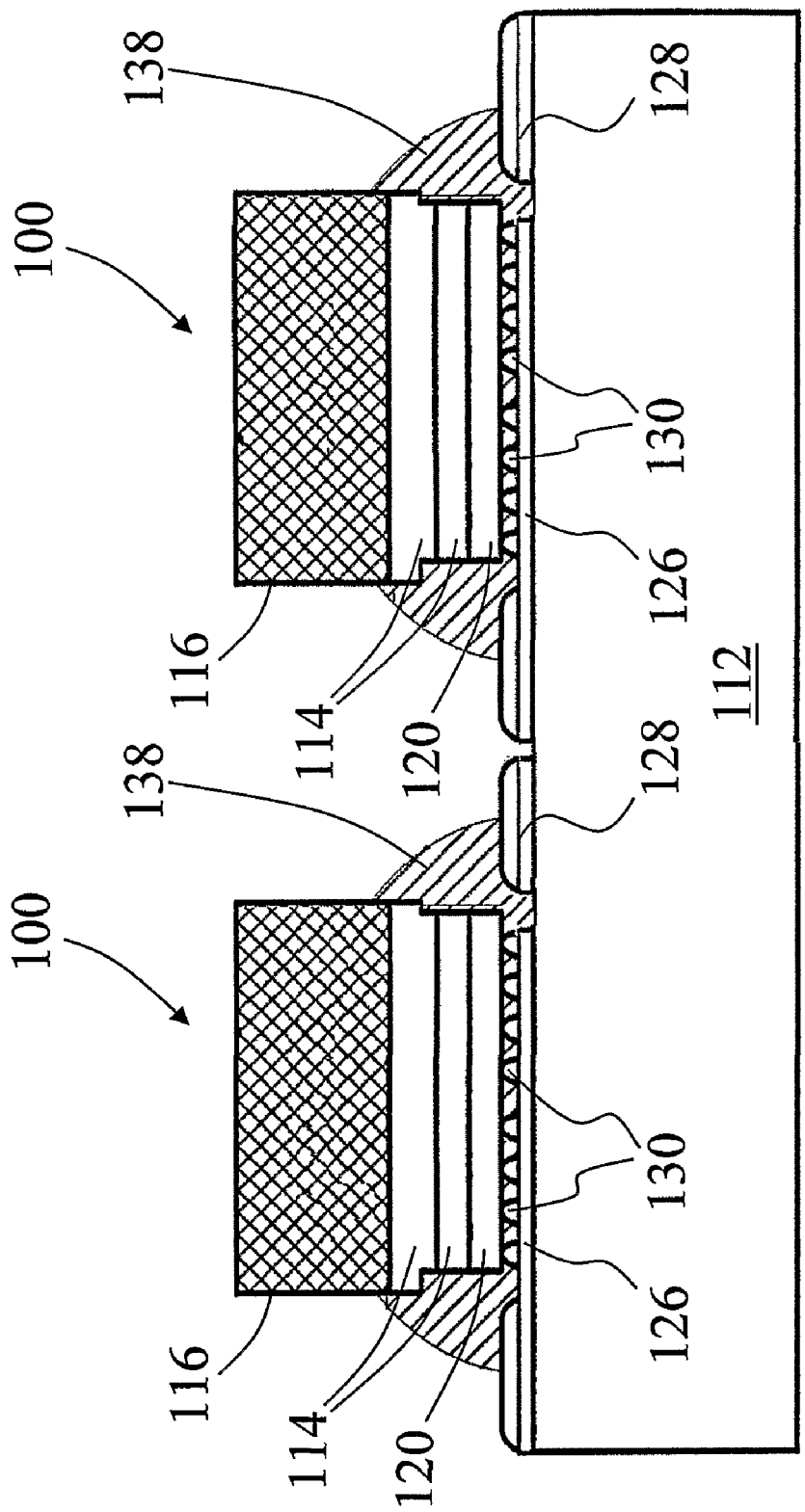
FIG. 4A shows a cross-sectional view of two light emitting diode dice having a vertical current flow geometry flip chip bonded to a mount, prior to substrate thinning and formation of a back-side electrode.

With reference to FIG. 4A, an embodiment employing devices having a vertical current flow geometry is described. Light emitting diode die 100 are shown in FIG. 4A flip-chip bonded to a mount 112. The light emitting diode die 100 have an epitaxial semiconductor device layers stack 114 disposed on a substrate 116. A first electrode 120 is formed on the device layers stack 114. Unlike the lateral current flow geometry of FIGS. 1A, 1B, and 3, only a single front-side electrode 120 is formed on the epitaxial layers stack 114. The first electrode 120 is flip-chip bonded to a first bonding pad 126 via bonding bumps 130. A second bonding pad 128 is not connected to the light emitting diode die 100 by flip chip bonding. Thus, at the point in fabrication shown in FIG. 4A, the light emitting diode die 100 are inoperative since there is no second electrode or electrical input thereto to drive the diode device.

Figure 4B:
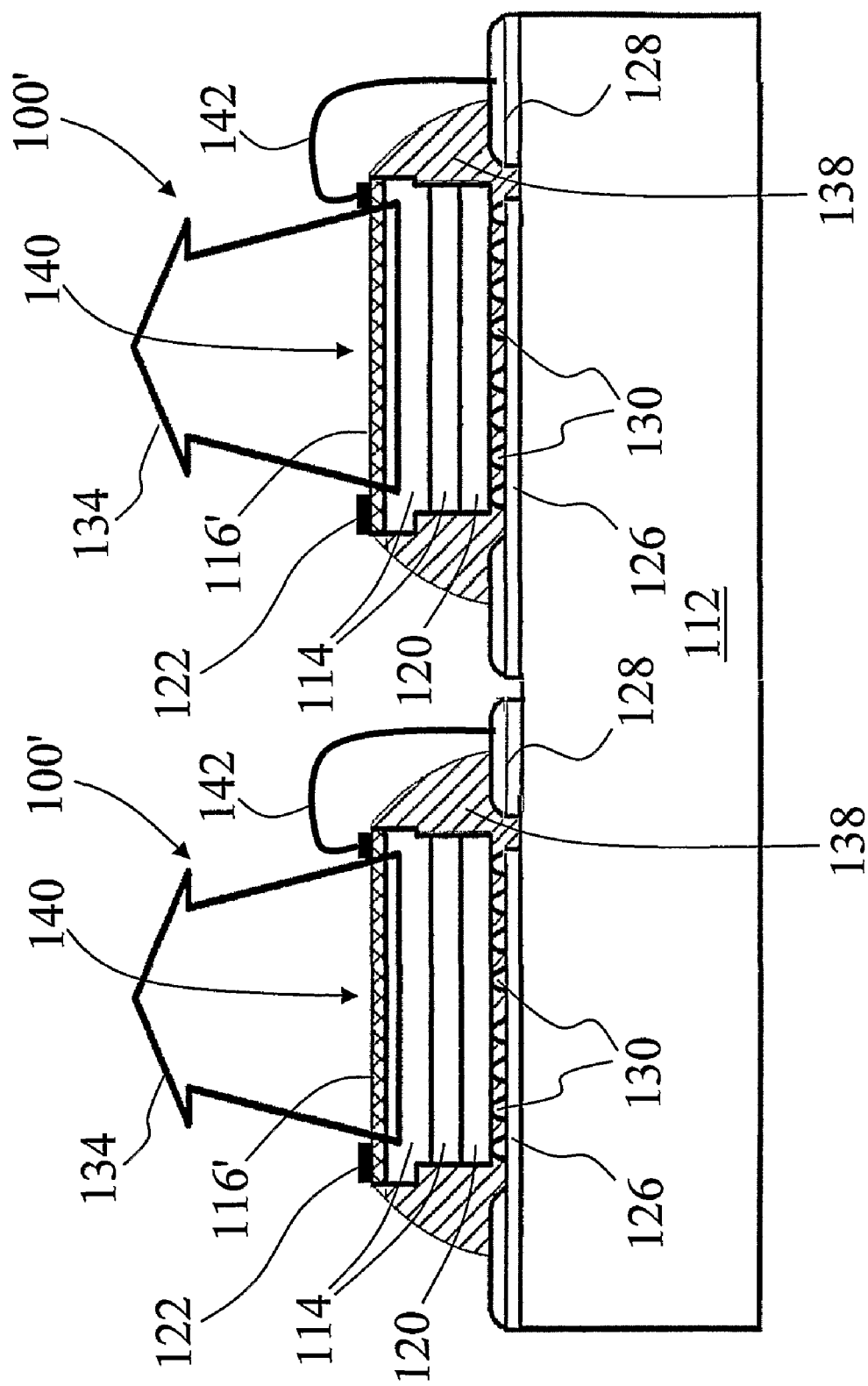
FIG. 4B shows a cross-sectional view of the two light emitting diode dice flip chip bonded to the mount as in FIG. 4A, after thinning of the substrates, formation of back-side electrodes, and wire-bonding of the back-side electrodes to wiring bonding pads of the mount.

With continuing reference to FIG. 4A and with further reference to FIG. 4B, an underfill material 138 is preferably disposed between the light emitting device die 100 and the mount 112 to provide mechanical support, improved securing of the device die 100 to the mount 112, and to provide optional encapsulation and improved heat sinking. The substrate 116 shown in FIG. 4A is thinned by mechanical grinding, laser ablation, wet chemical etching, dry etching, or the like to produce the thinned substrate 116'. A second electrode 122, which is a back-side electrode, is formed on the thinned substrate 116, which is an electrically conductive substrate. In the illustrated embodiment, the second electrode 122 is a ring electrode that defines a central optical aperture 140 of each modified light emitting diode die 100'. The second electrode 122 is electrically connected with the second bonding pad 128, which is a wiring bonding pad, by a wire bond 142. When energized by the electrodes 120, 122 the modified light emitting diode die 100' emits light 134 passing through the thinned substrate 116' within the optical aperture 140.

In the exemplary embodiment of FIG. 4B, the thinned substrate 116' is electrically conductive to enable a vertical current flow configuration. If, however, the substrate is electrically insulating, for example a sapphire substrate of a group III-nitride light emitting diode die, then the substrate can be completely removed analogously to the embodiment of FIG. 3, followed by formation of the backside contact on a layer of the semiconductor layers stack 114 that is exposed by the removal of the substrate 116.

By removing the substrate after flip chip bonding, a number of advantages are realized over past fabrication methods that performed wafer thinning prior to flip chip bonding. Fabrication processes for making the individual light emitting diode device die are performed on an epitaxial wafer that has a thick substrate wafer. This avoids damage during handling of thin-wafer devices, and thus improves device yield. Moreover, in the case of substrate removal by isotropic etching with an etch stop, performing such isotropic etching after dicing and flip-chip bonding allows the isotropic etch process to simultaneously remove material from both the back and the sides of the substrate wafer 16, 116. This can provide faster substrate removal, especially in the case of small-area devices. Moreover, inclusion of a supportive underfill material 38, 138 provides improved structural stability during and after the substrate thinning or removal process, again increasing yield. In certain embodiments, the supportive underfill material 38, 138 prevents mechanical failure and enables substrate thinning or removal to produce devices that cannot be generated as free-standing components.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

What is claimed is:

1. A method for fabricating a flip-chip light emitting diode device, the method including:
   (a) depositing epitaxial layers on a growth substrate to produce an epitaxial wafer;
   (b) fabricating a plurality of light emitting diode devices on the epitaxial wafer;
   (c) dicing the epitaxial wafer to generate at least one separated device die from the epitaxial wafer, said device die including at least one of the plurality of the light emitting diode devices and a portion of the growth substrate;
   (d) flip chip bonding the device die to a mount, said flip chip bonding including securing the device die to the mount by bonding an electrode of the device die to a bonding pad of the mount; and
   (e) subsequent to step (d), removing at least some of the growth substrate from the device die by laser lift-off.

2. The method of claim 1, further comprising:
   (f) prior to step (e), providing a support material that supports the device die relative to the mount.

3. The method of claim 2, wherein step (f) comprises:
   providing the support material in a flowable form that contacts the device die and the mount; and,
   hardening the support material into a non-flowable form.

4. The method of claim 2, further comprising:
   (g) subsequent to step (e), removing the support material.

5. The method of claim 2, wherein the support material is not electrically active.

6. The method of claim 1, wherein step (e) comprises:
   removing substantially the entire portion of the growth substrate from the device die by laser lift-off employing an excimer laser.

7. The method of claim 6, wherein step (e) comprises:
   illuminating the portion of the growth substrate included on the device die with laser light generated by the excimer laser.

8. The method of claim 7, wherein the growth substrate is made of sapphire and the laser light is ultraviolet laser light.

9. The method as set forth in claim 1, wherein the growth substrate comprises a sapphire growth substrate and the step (e) comprises:
   applying laser light selected to degrade an interface between the sapphire growth substrate and the epitaxial layers.

10. The method as set forth in claim 9, wherein the degrading of an interface between the sapphire growth substrate and the epitaxial layers includes formation of gallium metal and nitrogen, and the step (e) further comprises:
    elevating a temperature whereby the gallium metal melts and allows the sapphire growth substrate to be removed.

11. The method as set forth in claim 10, wherein the step (e) further comprises:
    cleaning residual gallium metal from a surface exposed by removal of the sapphire growth substrate.

12. A method for fabricating a flip-chip light emitting diode device, the method comprising:
    depositing epitaxial layers on a sapphire growth substrate to produce an epitaxial wafer;
    fabricating a plurality of light emitting diode devices on the epitaxial wafer;
    dicing the epitaxial wafer to generate a device die;
    flip chip bonding the device die to a mount, the flip chip bonding including securing the device die to the mount by bonding at least one electrode of the device die to at least one bonding pad of the mount; and
    with the device die flip chip bonded to the mount, removing the sapphire growth substrate of the device die using a laser lift-off process.

13. The method as set forth in claim 12, wherein the removing the sapphire growth substrate of the device die using a laser lift-off process comprises:
    applying laser light selected to degrade an interface between the sapphire growth substrate and the epitaxial layers.

14. The method as set forth in claim 13, wherein the degrading of an interface between the sapphire growth substrate and the epitaxial layers includes formation of gallium metal and nitrogen, and the removing the sapphire growth substrate of the device die using a laser lift-off process further comprises:
    elevating a temperature whereby the gallium metal melts and allows the sapphire growth substrate to be removed.

15. The method as set forth in claim 14, wherein the removing the sapphire growth substrate of the device die using a laser lift-off process further comprises:
    cleaning residual gallium metal from a surface exposed by removal of the sapphire growth substrate.

16. The method as set forth in claim 12, further comprising:
applying a stress relief agent comprising an underfill material to the device die prior to the removing of the sapphire growth substrate of the device die.

17. The method as set forth in claim 12, further comprising:
applying a coating material to the device die prior to the removing of the sapphire growth substrate of the device die.

18. The method as set forth in claim 17, wherein the coating material provides temporary support during the laser liftoff process, the method further comprising:
removing the coating material after the laser liftoff process is completed.

* * * * *